(12) United States Patent
Doblar et al.

(10) Patent No.: US 7,409,491 B2
(45) Date of Patent: Aug. 5, 2008

(54) SYSTEM MEMORY BOARD SUBSYSTEM USING DRAM WITH STACKED DEDICATED HIGH SPEED POINT TO POINT LINKS

(75) Inventors: Drew G. Doblar, San Jose, CA (US); Gabriel C. Risk, Palo Alto, CA (US); Chung-Hsiao R. Wu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 252 days.

(21) Appl. No.: 11/302,728

(22) Filed: Dec. 14, 2005

(65) Prior Publication Data
US 2007/0136537 A1    Jun. 14, 2007

(51) Int. Cl.
*G06F 13/14*    (2006.01)
(52) U.S. Cl. ...................... 711/103; 711/102
(58) Field of Classification Search ........................ None
See application file for complete search history.

(56) References Cited

U.S. PATENT DOCUMENTS

| | | |
|---|---|---|
| 6,295,586 B1 | 9/2001 | Novak et al. |
| 6,502,161 B1 | 12/2002 | Perego et al. |
| 6,571,325 B1 | 5/2003 | Satagopan et al. |
| 6,725,314 B1 | 4/2004 | Dong |
| 6,882,082 B2 | 4/2005 | Greeff et al. |
| 6,889,304 B2 * | 5/2005 | Perego et al. ............... 711/170 |
| 6,922,770 B2 | 7/2005 | Shanmugasundaram et al. |
| 6,941,428 B2 | 9/2005 | Carr |

(Continued)

FOREIGN PATENT DOCUMENTS

GB    2 416 056 A    1/2006

(Continued)

OTHER PUBLICATIONS

U.S. Appl. No. 11/124,848, filed May 9, 2005.

(Continued)

*Primary Examiner*—Than Nguyen
(74) *Attorney, Agent, or Firm*—Meyertons Hood Kivlin Kowert & Goetzel, P.C.; Rory D. Rankin

(57) ABSTRACT

A memory system comprising memory modules including memory chips stacked with switching circuits. A memory controller coupled to the memory modules is configured to initiate memory accesses. When a stacked switching circuit detects the memory access, the switching circuit routes the access to another memory module if the access is not directed to a memory chip of the receiving memory module, or processes the access locally if the access is directed to a memory chip of the receiving memory module. The memory controller and memory modules are coupled via bi-directional serial links. Each memory module may include multiple stacked switching circuits, each of which may be coupled to fewer than all of the memory chips within the memory module. Switching circuits further include circuitry configured to de-serialize data prior to conveyance to a memory chip, and serialize data received from a DRAM chip prior to transmitting the received data. Switching circuits may be coupled to a stacked memory chip via a flexible interconnect, and may also be manufactured side by side with a corresponding memory chip on a flexible circuit board.

17 Claims, 10 Drawing Sheets

U.S. PATENT DOCUMENTS

| | | |
|---|---|---|
| 7,017,022 B2 | 3/2006 | Jeddeloh |
| 7,032,092 B2 | 4/2006 | Lai |
| 7,051,151 B2 | 5/2006 | Perego |
| 7,257,129 B2 * | 8/2007 | Lee et al. .................... 370/464 |
| 2004/0030794 A1 | 2/2004 | Hugly et al. |
| 2004/0183795 A1 | 9/2004 | Deering et al. |
| 2005/0166026 A1 * | 7/2005 | Ware et al. .................. 711/167 |
| 2005/0198458 A1 | 9/2005 | Cho |
| 2006/0020740 A1 | 1/2006 | Bartley et al. |
| 2006/0024541 A1 | 2/2006 | Weiss et al. |

FOREIGN PATENT DOCUMENTS

| | | |
|---|---|---|
| WO | WO 2004/109528 A3 | 12/2004 |
| WO | WO 2005/066965 A2 | 7/2005 |

OTHER PUBLICATIONS

U.S. Appl. No. 11/304,166, filed Dec. 15, 2005.
U.S. Appl. No. 11/260,416, filed Oct. 27, 2005.
U.S. Appl. No. 11/205,706, filed Aug. 17, 2005.
U.S. Appl. No. 11/249,099, filed Oct. 12, 2005.
U.S. Appl. No. 10/975,650, filed Oct. 28, 2004.
U.S. Appl. No. 10/989,577, filed Nov. 16, 2004.
Fully Buffered DIMM (FB-DIMM) Server Memory Architecture: Capacity, Performance, Reliability and Longevity- Feb. 18, 2004- Retrieved from http://www.idt.com/content/OSA_FB-DIMM-arch. pdf VOGT-Note connections of FB-DIMM's on p. 9.

* cited by examiner

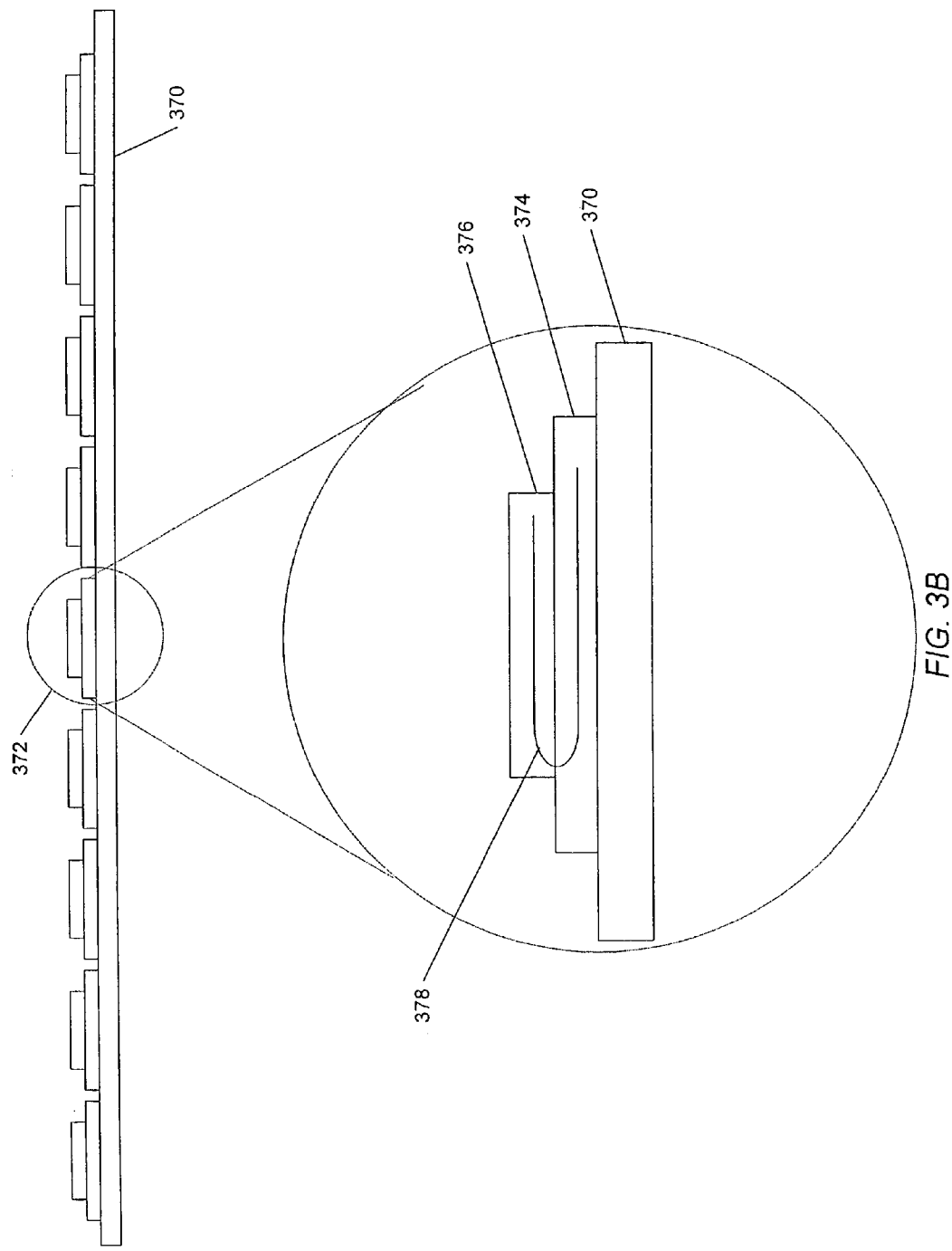

SYSTEM MEMORY BOARD SUBSYSTEM USING DRAM WITH STACKED DEDICATED HIGH SPEED POINT TO POINT LINKS

BACKGROUND OF THE INVENTION

1. Field of the Invention

This invention relates to memory subsystems and, more particularly, to the topology of a memory system architecture.

2. Description of the Related Art

Over the years, demands placed upon computing systems have increased. As demands increase and technology has advanced, efforts have been made to both increase the capacity of memory systems and reduce memory system latencies. In recent years, various proposals have been made, including proposals for fully-buffered dual-inline memory modules (FB-DIMMs). Traditionally, DIMMs have been configured to buffer both addresses and commands, but the data interface itself has been unbuffered. For a variety of reasons, including loading considerations, such designs have been unable to provide sufficiently high data rates when multiple DIMMs are placed on the same data channel. As a result, DIMMs that buffer data (i.e., FB-DIMMS), as well as addresses and commands, have been proposed. One such proposal includes a buffer chip on each DIMM and uses high-speed unidirectional point-to-point signaling between the memory controller and between DIMMs.

FIG. 1 (prior art) illustrates one embodiment of such a proposal which is being authored by the Joint Electron Device Engineering Council (JEDEC). Among other things, the proposal concerns FB-DIMMs which offer greater capacity including scalability of up to 192 GB and as many as six channels and eight DIMMs per channel. In the example shown, a system 100 is depicted which includes a processing unit 110, a host 120, and memory modules 130A, 130B, 130C, 130D, 130E, 130F. Each of the memory modules 130 are FB-DIMMs 130 and are configured on a channel 156 from the host 120 (e.g., a memory controller) which is in turn coupled to a processing unit 110. Elements referred to herein with a particular reference number followed by a letter will be collectively referred to by the reference number alone. For example, memory modules 130A-130F may be collectively referred to as memory modules 130. In addition, each of the FB-DIMMs 130A-130F includes an advanced memory buffer (AMB) 140A-140F, respectively. Each AMB 140 on the channel 156 must be uniquely identifiable to be addressable by the system.

A first FB-DIMM 130A is coupled to the host 120 by two separate links (160, 170). The first of these links 160 may be referred to as a "downstream" or "southbound" link, in which the first FB-DIMM 130A receives data and/or commands from host 120. The second of these links 170 may be referred to as an "upstream" or "northbound" link, by which data is conveyed from FB-DIMMs 130 to host 120. The remainder of the FB-DIMMs 130 in the embodiment shown are coupled to each other through a plurality of upstream and downstream links as illustrated. In general, a link may be referred to as an upstream link if information conveyed through the link is flowing towards the host 120, while a link may be referred to as a downstream link if information conveyed through the link is flowing away from host 120. The FB-DIMMs 130 are coupled to each other in what is commonly referred to as a "daisy-chain" arrangement.

Generally speaking, downstream communication takes place by sending fixed-size frames on the downstream links, with each frame being sent to each FB-DIMM 130 in turn. These downstream frames are generally pipelined one after another without any gaps. The content of all downstream frames is conveyed from the host 120. Upstream communication takes place by sending a pipelined sequence of fixed-size frames on the upstream links. The content of upstream frames may be updated by FB-DIMMs 130 as they are forwarded by them. All read and write commands, as well as write data, are sent on the downstream links. All read data is sent on the upstream links.

Scheduling of reads and writes is performed by host/memory controller 120. In order to simplify the scheduling, all read data is returned in the order in which it was requested. Thus, data read from a particular FB-DIMM 130 is placed in the first available upstream frame following the availability of the data, while data read from the first FB-DIMM 130A is delayed until the appropriate upstream frame passes it. Each FB-DIMM 130 knows the required latency from when it receives the downstream read command to when it inserts the corresponding read data into an upstream packet (these latencies must be deterministic; they are proposed to be configured during power-on of the channel, although there are questions about the deterministic nature of this initialization scheme). For example, if the propagation delay from one FB-DIMM to another is D ns and the latency for reading data on an FB-DIMM is R ns, and if there are no delays due to framing alignments, the Nth FB-DIMM from the host 120 would provide its read data R ns after receiving its command and the FB-DIMM nearest to the host would provide its read data R+2*(N−1)*D ns after receiving its command. Therefore, regardless of which FB-DIMM 130 is being read, the corresponding read data would arrive at the memory controller R+2*N*D ns after the command was sent out. Example values of N may typically vary from 1 to 8 or 16 and typical values of D may be in the range of 2 ns.

While the proposed scheme may provide for improvements over prior technologies, the limited number of DIMMs which may be utilized may be seen as undesirable. In addition, the nature of the above described latencies may also be undesirable.

In view of the above, an effective and efficient memory architecture is desired.

SUMMARY OF THE INVENTION

Memory systems and methods are contemplated.

A memory subsystem is contemplated which includes a host coupled to a plurality of memory modules. The host is configured to initiate memory accesses to one or more of the memory modules. Each of the memory modules includes at least one stacked switching circuit configured to route data between itself and the memory controller, or other memory modules. When a stacked switching circuit detects a memory access, the switching circuit determines whether the memory access is directed to a memory chip to which the switching circuit is coupled. If the access is directed to a memory chip coupled to the circuit, the switching circuit processes the access locally within the memory module. However, if the circuit determines the access is not directed to a memory chip of the same memory module, the circuit routes the detected access to a switch in another memory module.

Also contemplated is a memory subsystem wherein links between memory modules, or between a memory module and a memory controller, comprises bi-directional serial links. Each of the switching circuits further comprises circuitry configured to de-serialize data and serialize data. Each switching circuit is configured to de-serialize data prior to conveyance to a memory chip, and each switching circuit is configured to serialize data received from a memory chip prior to transmitting the received data to the memory controller.

Also contemplated is a memory subsystem wherein each memory module includes a plurality of memory chips and two or more stacked switching circuits. Each of the switching circuits is coupled to fewer than all of the memory chips on a given memory module. In order to more efficiently utilize printed circuit board space, embodiments are contemplated in which switching circuitry is stacked on top of one or more of the memory chips of a memory module. Various technologies are contemplated for stacking the circuitry. In one embodiment, memory chips and switching circuitry may be manufactured on flexible circuit boards which are then folded to stack the switching circuit and memory chip.

These and other aspects of the invention will become apparent upon reading the following detailed description and upon reference to the accompanying drawings.

BRIEF DESCRIPTION OF THE DRAWINGS

FIG. 3B illustrates one embodiment of a memory module with stacked switching circuits and memory chips.

Figure 1:
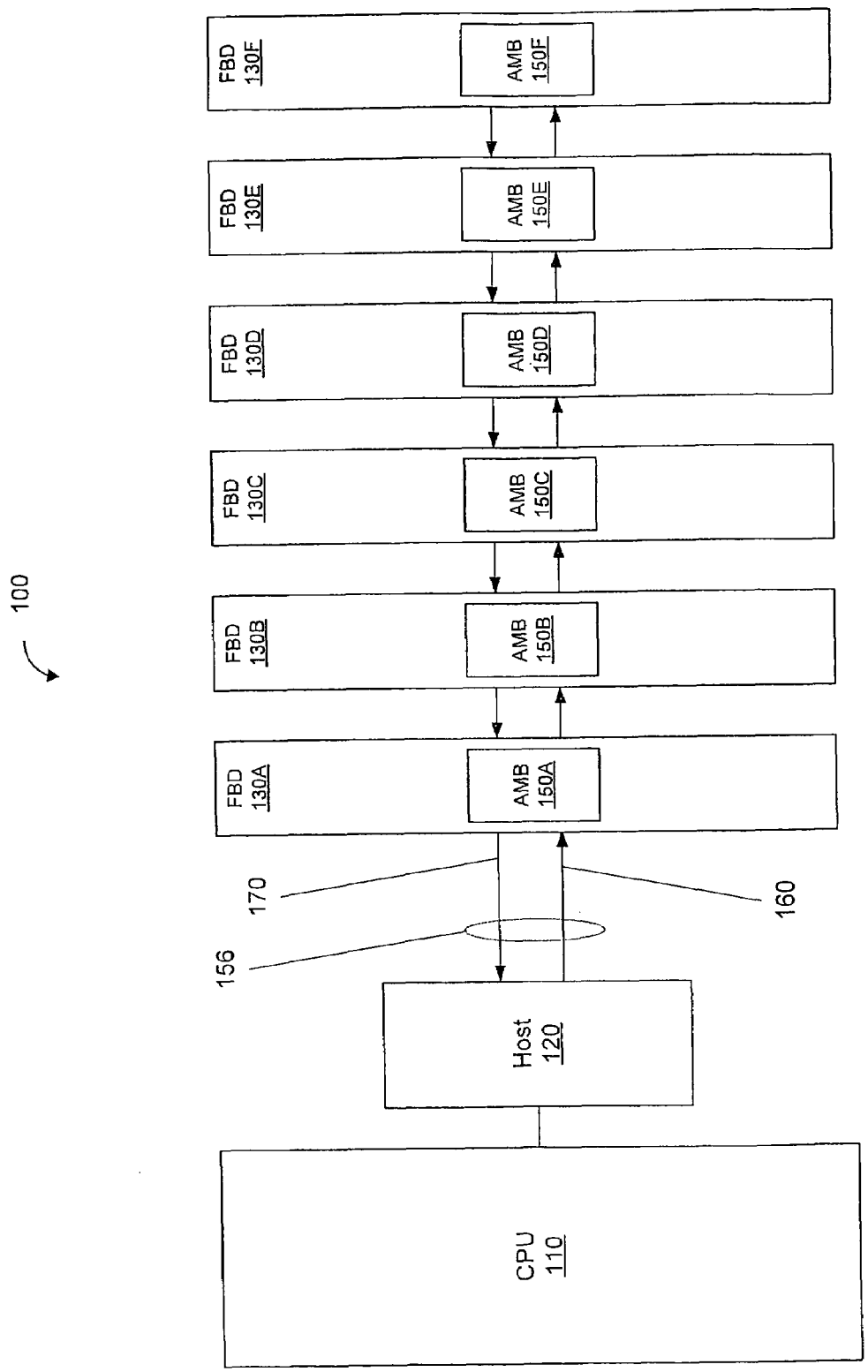
FIG. 1 (Prior Art) is a block diagram of one embodiment of a memory subsystem.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
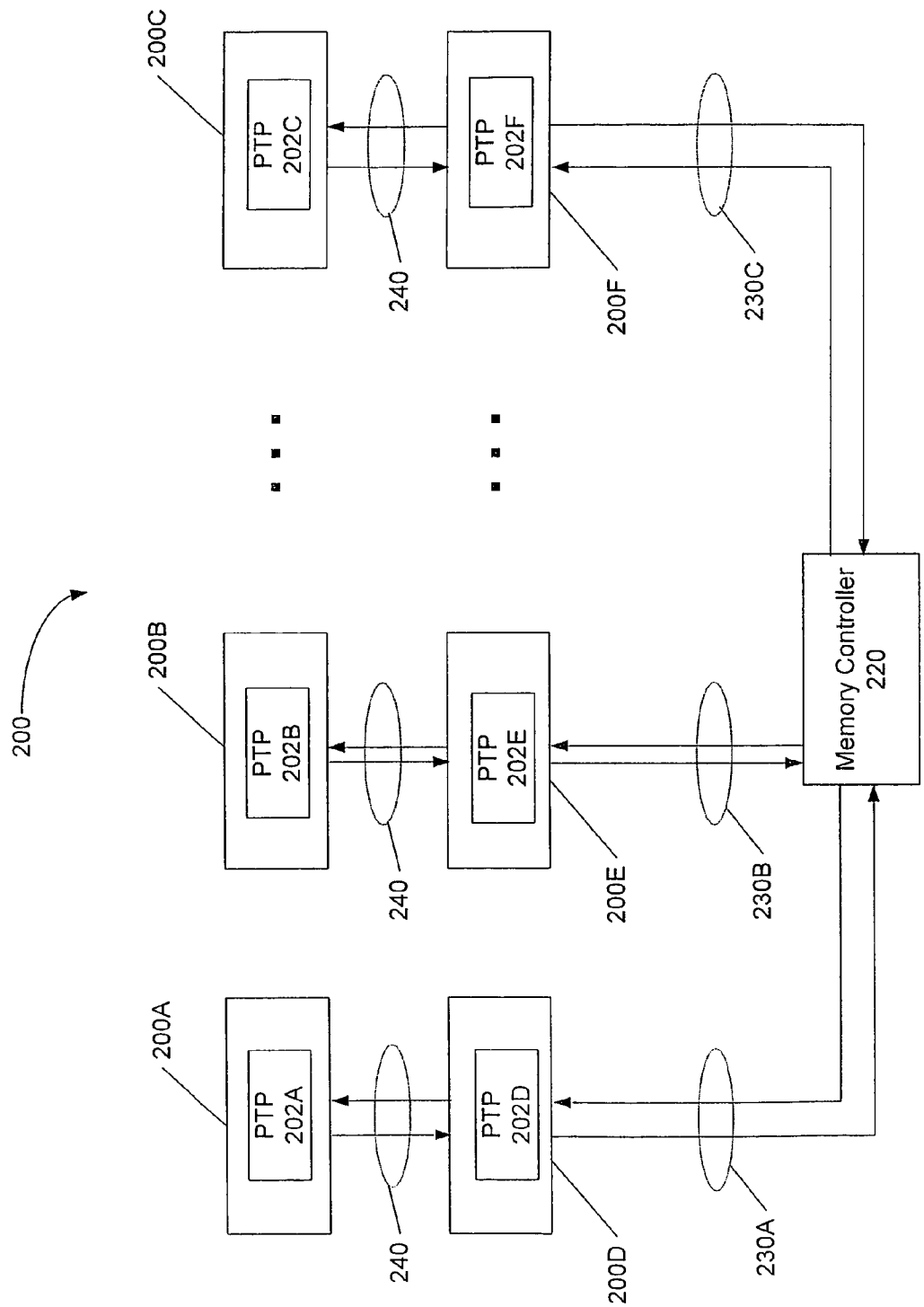
FIG. 2 is a block diagram of one embodiment of a portion of a memory subsystem including point to point links.

Turning now to FIG. 2, one embodiment of a memory subsystem is shown. In the example, a memory controller 220, or "host", is shown coupled to memory modules 200D, 200E, and 200F, via links 230A, 230B, and 230C, respectively. For ease of illustration, FIG. 2 only depicts the memory controller 220 as being directly coupled to three memory modules. However, as noted by the ellipses in FIG. 2, more memory modules than those shown may be coupled to memory controller 220. In one embodiment, memory controller 220 may be directly coupled to sixteen. However, other embodiments may include fewer or greater than sixteen modules. In addition, it is to be understood that the memory controller 220 may comprise one or more chips or devices.

FIG. 2 also shows each of memory modules 200D-200F to be coupled to further memory modules via links 240. In particular, memory module 200D is coupled to memory module 200A, memory module 200E is coupled to memory module 200B, and memory module 200F is coupled to memory module 200C. In the embodiment shown, each memory module 200 includes circuitry configured to support point-to-point communications. For example, each of memory modules 200A-200F includes point-to-point circuitry 202A-202F, respectively. In one embodiment, links 230A-230C comprise serial communication links configured to convey commands and data from the memory controller 220 to one of memory modules 200D-200F, and serial communication links configured to convey data from each of memory modules 200D-200F to memory controller 220. In addition, links 240 comprise serial communication links configured to convey commands and data between the respective memory modules. It is noted that various portions of the system of FIG. 2 and other systems described herein may be configured via a bus (not shown), such as an I$^2$C bus, system management bus (SMBus), or any other suitable bus or communications link.

In one embodiment, communications upon serial links 230 and 240 are configured as identifiable packets. Each packet may include address, commands, data, or otherwise. In one embodiment, each circuit 202 within a given memory module 200 is configured to act as a switch by either switching packets locally (i.e. within the corresponding memory module), or by switching packets to or from the next memory module (or the memory controller in the case of circuits 202D-202F). Therefore, memory controller 220 may initiate an access corresponding to memory module 200D. In response to detecting the access, circuit 202D detects that the access is directed to the local memory module and processes the packet(s) locally. If the access is a read access, memory module 200D may then perform the read access and convey the read data directly back to the memory controller 220 via links 230A. In one embodiment, each of links 230 and 240 may comprise multiple parallel lanes upon which serial data may be conveyed.

In an alternative scenario, memory controller 220 may initiate an access memory module 200B via memory module 200E. In such a scenario, memory module 200E determines (e.g., via an address or command packet) that the packets are not directed to memory module 200E. Therefore, circuit 202E routes the received packets to memory module 200B. Circuit 202B may then determine the access is directed to memory module 200B and process the packets locally. If a read access were being initiated, the read data would be returned by circuit 202B to the memory controller 220 via circuit 202E.

In the embodiment of FIG. 2, each of memory modules 200 may comprise a dual inline memory module (DIMM) comprising multiple dynamic random access memory (DRAM) chips. In addition, each of circuits 202 may be configured to access all DRAM chips of the memory module corresponding to the circuit 202. For example, circuit 202D may be configured to access all DRAM chips on memory module 200D. However, in alternative embodiments, switching circuitry within a given memory module may not be configured to access all DRAM chips within the memory module.

Figure 3A:
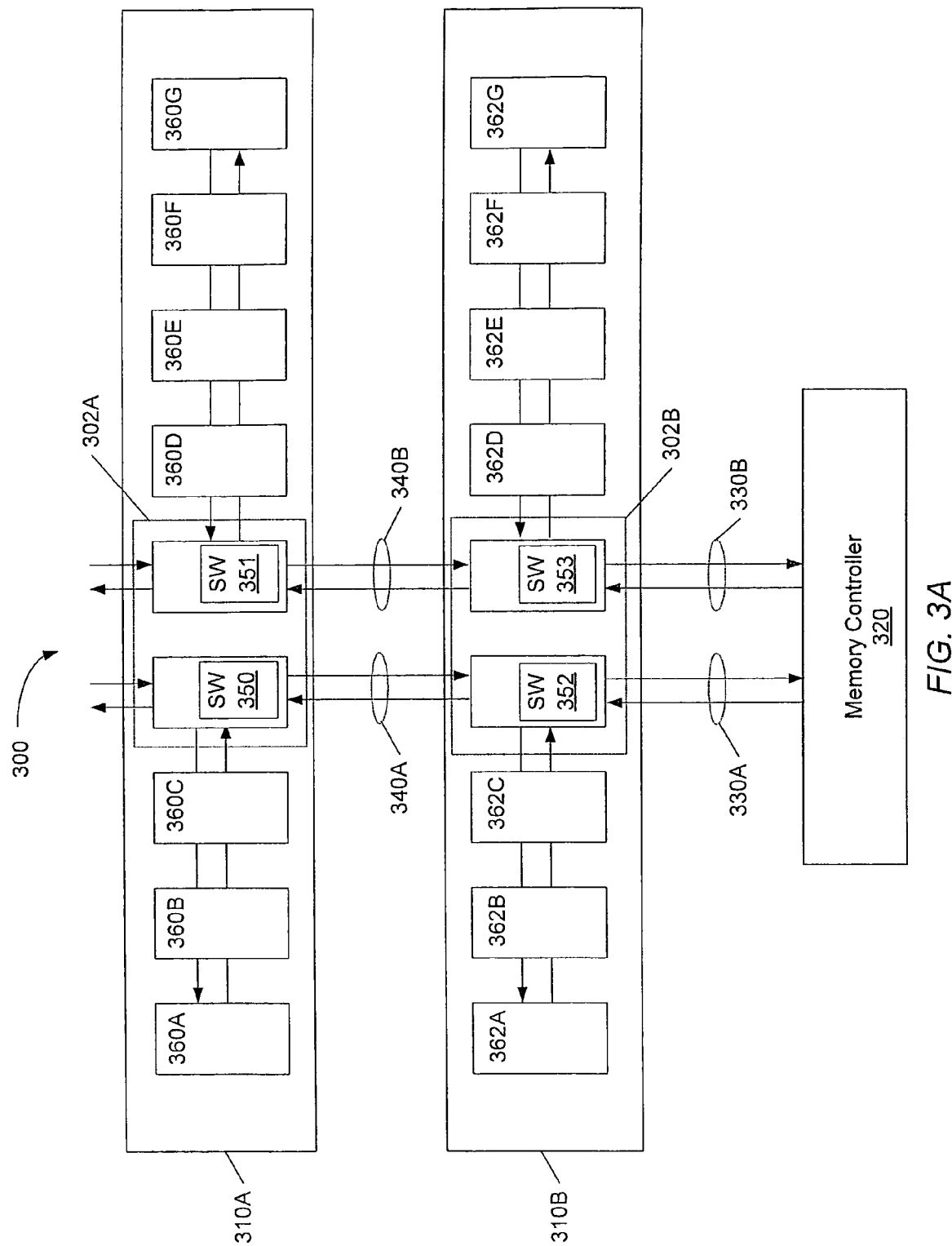
FIG. 3A is a block diagram of one embodiment of a portion of a memory subsystem with switching circuits.

FIG. 3A depicts one embodiment of a memory subsystem 300 wherein switching circuits (302A-302B) within memory modules (310A-310B) are configured to access selected DRAM chips of the memory module. In the example shown in FIG. 3, a memory controller 320 is shown coupled to a memory module 310B via links 330A and 330B. Memory module 310A is in turn coupled to memory module 310A via links 340A and 340B. Memory controller 320 may also be coupled to other memory modules via multiple links in a similar fashion. In the example of FIG. 3, each memory module includes switching circuitry (302A and 302B) configured to either route data locally or externally. However, in contrast to the above embodiment, the switching circuitry included within each of memory modules 310 includes multiple switching circuits, each of which is configured to access a separate group of DRAM chips on the respective memory module. For example, circuitry 302B on memory module 310B includes switching (SW) circuits 352 and 353. Circuitry 302A on memory module 310A includes switching circuits 350 and 351. In the embodiment shown, switching circuit 352 is coupled to access DRAM chips 362A, 362B, and 362C only. Switching circuit 353 is coupled to access DRAM chips 362D, 362E, 362F, and 362G only. In memory module 310A, switching circuit 350 is coupled to access DRAM chips 360A-360C, and circuit 351 is coupled to access DRAM chips 360D-360G.

Generally speaking, each of the switching circuits 350-353 may act as a router. If an access is not directed to a DRAM chip to which a particular switching circuit is coupled, the switching circuit may simply forward the access to a next memory module. For example, memory controller 320 may initiate a read access for data stored within one or more of DRAM chips 360A-360C. The memory module 320 may generate the appropriate signals upon link(s) 330A in order to perform the read access. Switch 352 then detects the access signals (e.g., in the form of a frame, packet, or otherwise) and determines whether the address being accessed corresponds to one of the DRAM chips 362A-362C to which it is coupled. Having determined the read access is not directed to one of DRAM chips 362A-362C, switching circuit 352 then forwards the access data to switch 350. Switch 350 then determines the access is directed to one or more of DRAM chips 360A-360C and performs the access. Switch 350 then returns the read data to the memory controller 320 via switch 352.

In one embodiment, responses conveyed by a switch (350-353) back to memory controller 320 may include an indication which identifies the data as response data. In response to detecting such an indication, a given switch 350-353 may readily determine the data is directed to the memory controller 320 and simply forward the data toward the memory controller 320 with little or no additional processing of the data involved. Alternatively, switches 350-353 may be configured such that data received from another switch in the direction of the memory controller 320 is always assumed to be directed to the memory controller and automatically forwarded to the memory controller 320. As may be appreciated, data may traverse one or more switching circuits on its way from a given memory module to the memory controller 320.

In addition to the above, switching circuits 350-353 may generally be configured to convey data utilizing a shortest possible path. For example, as discussed above, prior art proposals have described a ring type topology among memory modules in which data traverses a ring of links irrespective of the source or destination of the communication. However, in the present embodiment, data conveyed between the memory controller 320 any given memory module 310 is performed in as direct a manner as possible. For example, if the memory controller 320 initiates a memory access corresponding to data stored within memory module 3101B, the memory controller 320 may generally convey commands directly to circuit 352. Data or responses received from the memory module 310B are then conveyed directly back to the memory controller 320 without traversing any other switches or modules in the system. In this manner, memory access latencies may be reduced.

As noted above, in one embodiment, links 330 and 340 may comprise serial links configured to convey data serially. Accordingly, data conveyed between switches (350-353), and data conveyed between the memory controller and a switch, may be conveyed serially. In one embodiment, when a switch 350-353 detects an access is directed to one of the DRAM chips to which it is coupled, the switching circuit may be configured to perform a serial to parallel data conversion, and vice-versa.

In one embodiment, switching circuitry is stacked on top of one or more DRAM chips in order to more efficiently utilize available "real estate" on the memory board 310. For example, switching circuit 352 may represent a circuit which is stacked on top of a memory chip. FIG. 3B illustrates the stacked nature of such an embodiment. In the example shown, the cross section of a memory module 370 is shown which includes a number of DRAM chips. An enlarged view of one of the DRAM chips 372 is shown as well. In the enlarged view, a switching circuit 376 is shown stacked on top of a DRAM chip 374, which is in turn mounted on memory module 370. In the embodiment shown, switching circuitry 376 is coupled to DRAM chip 374 via a flexible interface 378. Various stacking techniques are depicted in FIGS. 3C-3E.

Figure 3C:
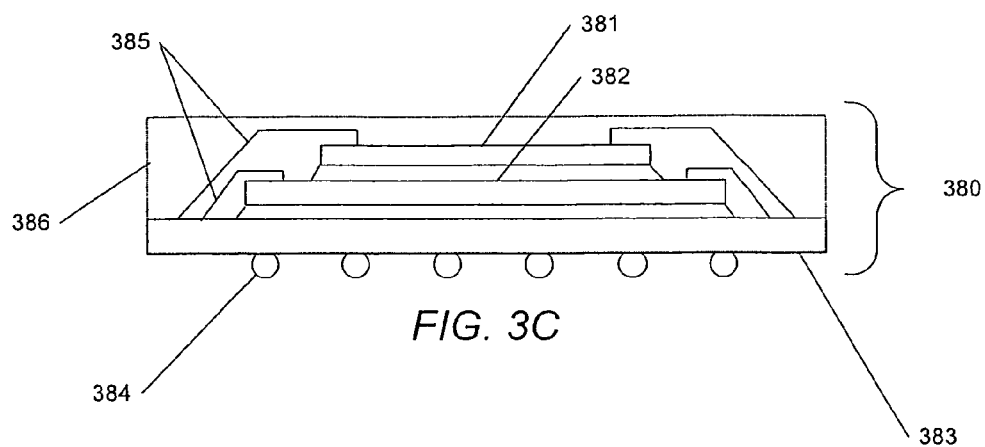
FIG. 3C illustrates one embodiment of die stacking of a memory chip and switching circuit.

FIG. 3C illustrates one embodiment 380 which utilizes a die on die approach to stacking. Die (or "chip") stacking is the process of mounting multiple die on top of each other within a single semiconductor package. Using such an approach, the amount of silicon chip area that can be housed within a single package may be increased. In addition, given the shorter routing of interconnections between circuits, die stacking may also result in better electrical performance of the device. Performance improvements may results from faster signal propagation and a reduction in noise and cross-talk.

In the example of FIG. 3C, a package 386 is depicted which illustrates a pyramid stacking technique in which a smaller die 381 is stacked on top of a larger die 382. Each of the die 381-382 is coupled to a substrate 383 via wire bonds 385. Also illustrated are solder balls 384. Utilizing a pyramid stacking technique, access to the top of die 382 for purposes of bonding may be more easily achieved than if both die 381 and 382 were the same size. In one embodiment, die 381 may comprise a switching circuit, such as circuit 352 of FIG. 3A, and die 382 may represent a memory chip. Numerous other types of die stacking are possible and are contemplated.

Figure 3D:
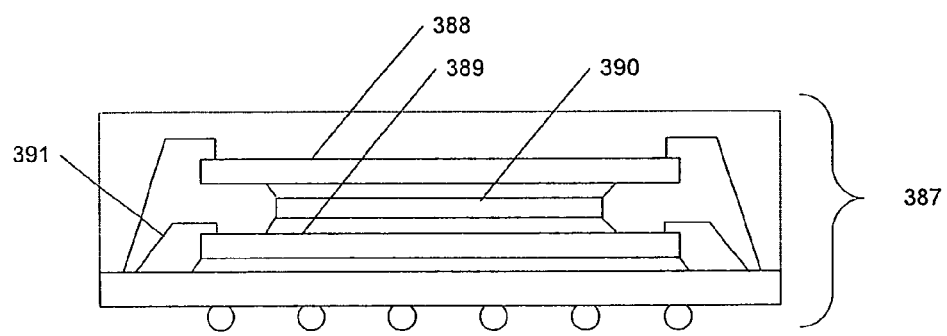
FIG. 3D illustrates one embodiment of die stacking of a memory chip and switching circuit.
Figure 3E:
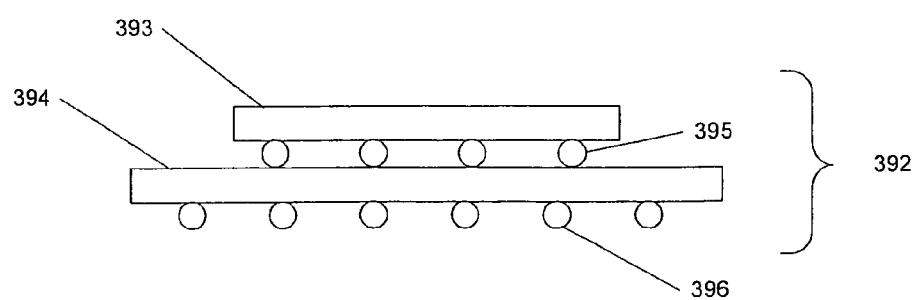
FIG. 3E illustrates one embodiment of package stacking of a memory chip and switching circuit.

FIG. 3D illustrates an embodiment 387 utilizing a stacking technique in which two die of the same size are stacked upon one another. In this example, a die 388 is stacked on a die 389. As die 388 is as large as die 389, it is necessary to include an interposing layer 390 (a "spacer") in order to create space on top of the die 389 for attaching bond 391. Finally, FIG. 3E illustrates an embodiment 392 which utilizes package stacking. In the embodiment shown, a first package 393 is stacked upon another package 394, with solder balls shown between. Each of packages 393 and 394 may itself comprises stacked die as discussed above. While the above embodiments depict the stacking of two die or two packages, other embodiments may stack more than two die or packages.

Figure 4:
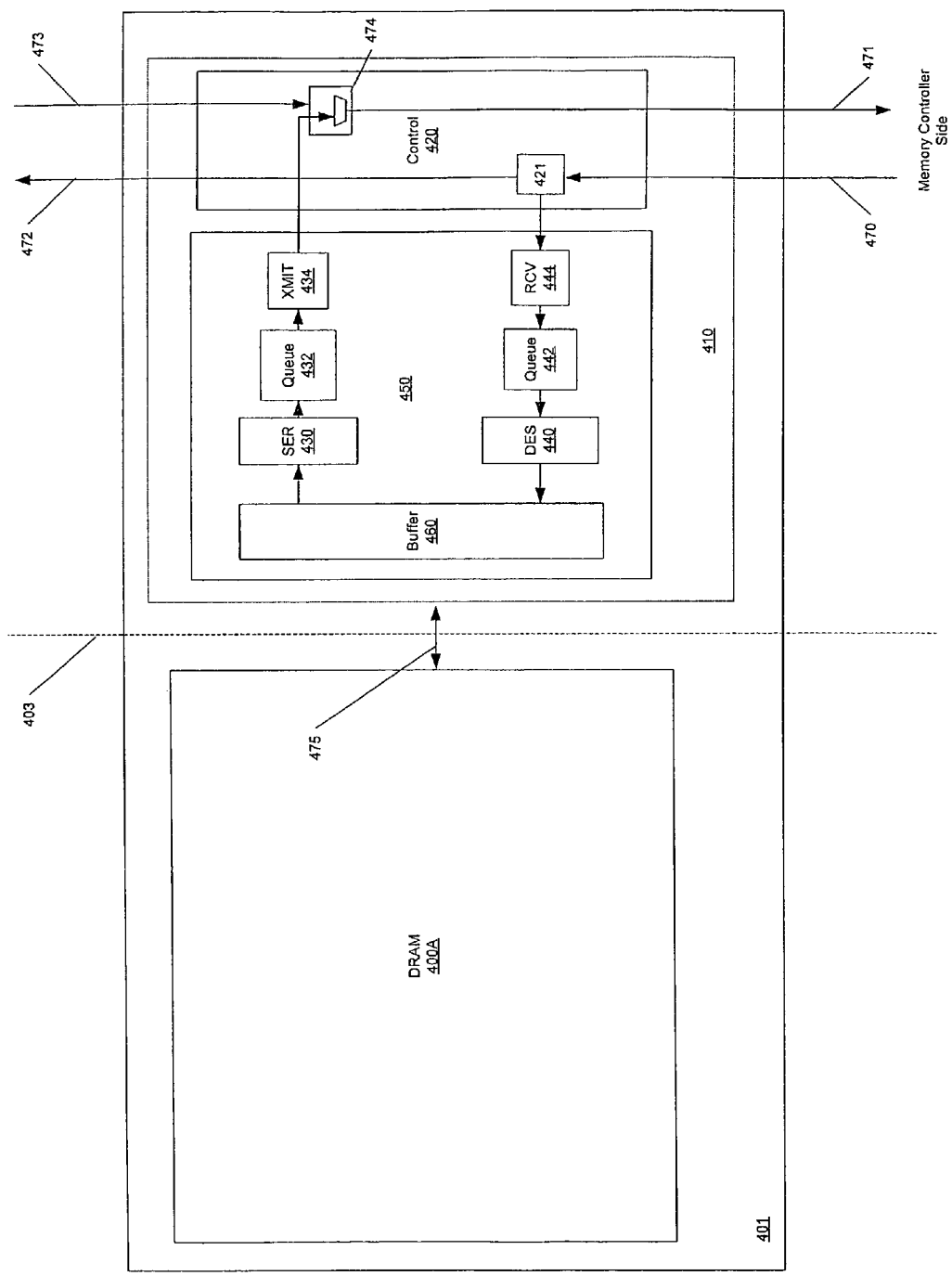
FIG. 4 is a block diagram of one embodiment of a portion of a memory subsystem including serializing and de-serializing circuitry with a flex interface.

FIG. 4 depicts one embodiment of a switching circuit 410 which includes a serializer-de-serializer (SerDes) circuit 450. Circuit 410 is coupled to one or more DRAM chips (400A-400N) and is also shown to include control circuitry 420. In one embodiment, control circuitry 420 is configured to receive communications via link 470 coming from a memory controller (either directly or via one or more intervening switches). Control unit 420 is further configured to convey communications via link 471 toward a memory controller. Control unit 420 further includes circuitry 421 configured to determine whether a serial communication received via link 470 is directed to one of DRAM chips 400A-400N. For example, circuitry 421 may examine a portion of a received address to determine whether it corresponds to DRAM chips 400. If the received communication does not correspond to one of DRAM chips 400, circuit 421 may then forward the communication via serial link(s) 472 to another memory module. However, if the circuit 421 determines the communication (i.e., a read or write access) is directed to one of DRAM chips 400, circuit 421 may then convey the received serial communication to SerDes unit 450.

In one embodiment, switching circuit 410 and DRAM 400A may be manufactured on a flexible circuit board 401 using a folded stacked approach. In such an approach, a switching circuit die 410 and DRAM die 400A are manufactured side by side and then folded to produce a stacked device similar to that discussed above. For example, board 401 may be folded at the line 403 shown in FIG. 4. In other embodiments, the entire board 401 may not be flexible, but the interconnect 475 between DRAM 400A and circuit 410 may be flexible to allow folding of one die onto the other. All such alternative techniques are contemplated.

SerDes unit 450 includes a receive processing path which includes a receiver (RCV) 444, queue 442, and de-serializer 440. SerDes unit 450 also includes a transmit processing path which includes a serializer 430, queue 432, and transmitter (XMIT) 434. In one embodiment, data transferred between DRAM chips 400 and SerDes unit 450 is performed in a parallel manner. However, as already discussed, data transferred on links 470-473 is accomplished serially. Therefore, SerDes unit 450 is included to perform data conversions. Generally speaking, circuit 421 is configured to examine the serial data received upon link 470 and determine whether it is directed to one of DRAM chips 400. For example, in one embodiment, serial communications upon link 470 may be conveyed as frames which are demarked by identifiable sequences of data (e.g., identifiable start bit sequences, end bits, etc.). Each frame may include predetermined fields which are configured to store particular types of data, such as addresses, commands, data, and so on. Upon receiving an entire frame, or a sufficient portion of a frame, circuit 421 may examine an address field of the frame (or other data within the frame which may indicate a target of the communication) to determine whether the communication is directed to one of DRAM chips 400.

If one of DRAM chips 400 is a target of the communication, circuit 421 may then begin conveying the received data to receiver 444. Receiver 444 may then begin storing the serial data in a queue 442 or other buffering device. Deserializer 440 may then detect the data within the queue 442, or otherwise receive an indication that serial data has been received for processing, and process the serial data so that it conforms to an alternative format for use in accessing the DRAM chips 400. Upon deserializing the serial data, deserializer 440 may store corresponding commands and/or data in a buffer 460 where it is made available for accessing the DRAM chips 400.

Data received from a DRAM chip 400 undergoes a serialization process whereby it is made suitable for conveyance upon a serial data link. For example, in response to a read access, a DRAM chip may return data to switch 410. In one embodiment, the returned data is latched in buffer 460 for processing by serializer 430. Serializer 430 generally consumes and transforms the data stored in buffer 460 and stores the resulting serialized version of the data in a queue 432 or other buffer, whereupon it is transmitted by the transmitter 434 via the serial links. As shown in the example, control unit 420 not only receives serial data from transmitter 434, but from another switch (not shown) via serial link 473 as well. Control unit 474 includes multiplexing logic 474 which manages the flow of data from switch 410 toward the memory controller. If control unit 420 detects transmitter 434 has data to transmit, and detects serial link 473 is idle, control unit 474 may select data from transmitter 434 for transmission via link 471. Where it is determined that both transmitter 434 and link 473 are attempting to transmit data, control unit 420 may utilize any suitable algorithm to ensure neither is prevented from conveying its data. For example, a straightforward algorithm may simply dictate a round-robin type approach to ensure all data gets conveyed. Those skilled in the art will appreciate there are numerous such algorithms and all such algorithms are contemplated.

In an alternative embodiment, control unit 420 may include circuitry configured to deserialize received data. For example, deserializer 440 may be included in control unit 420. The control unit 420 may further be configured to determine routing and other information from the incoming serial data stream. In an embodiment wherein control unit 420 is configured to perform deserialization, units 444 and 442 may then be configured to operate on deserialized signals rather than serial signals. Similarly, serializer unit 420 could be located within control unit 420. In such a case, units 432 and 434 may be configured to operate on non-serial data. Numerous such alternatives are possible and are contemplated.

It is noted that while the above description depicts and describes switching circuits (e.g., 410) in a manner which may seem to indicate they are completely separate entities from the DRAM chips (which is one possible embodiment), in other embodiments, the switching circuitry may in fact be integrated directly into a given DRAM chip. In such an embodiment, the DRAM chip in which the switching circuit is incorporated is by definition accessible by that switching circuit. In various embodiments, a given memory module may have any number of such DRAM chips. For example, all DRAM chips on a given memory modules may include such switching circuitry. Alternatively, only one or more selected DRAM chips on a memory module may include such switching circuitry. All such alternative embodiments are contemplated.

In the discussion herein, various references are made to point-to-point links and/or serial links. In various embodiments, such links may have multiple loads. For example, the serial channels discussed herein may be coupled to more than a single receiver. Such coupling may be direct, or may be accomplished via other coupling techniques such as capacitive coupling. In one embodiment, one or more additional receivers may be coupled to a given channel in order to provide for greater channel integrity or robustness. Alternatively, or in addition, receivers may be added to channels for the purpose of monitoring the integrity of signal paths during testing or otherwise in order to aid in identifying and locating faults.

Figure 5:
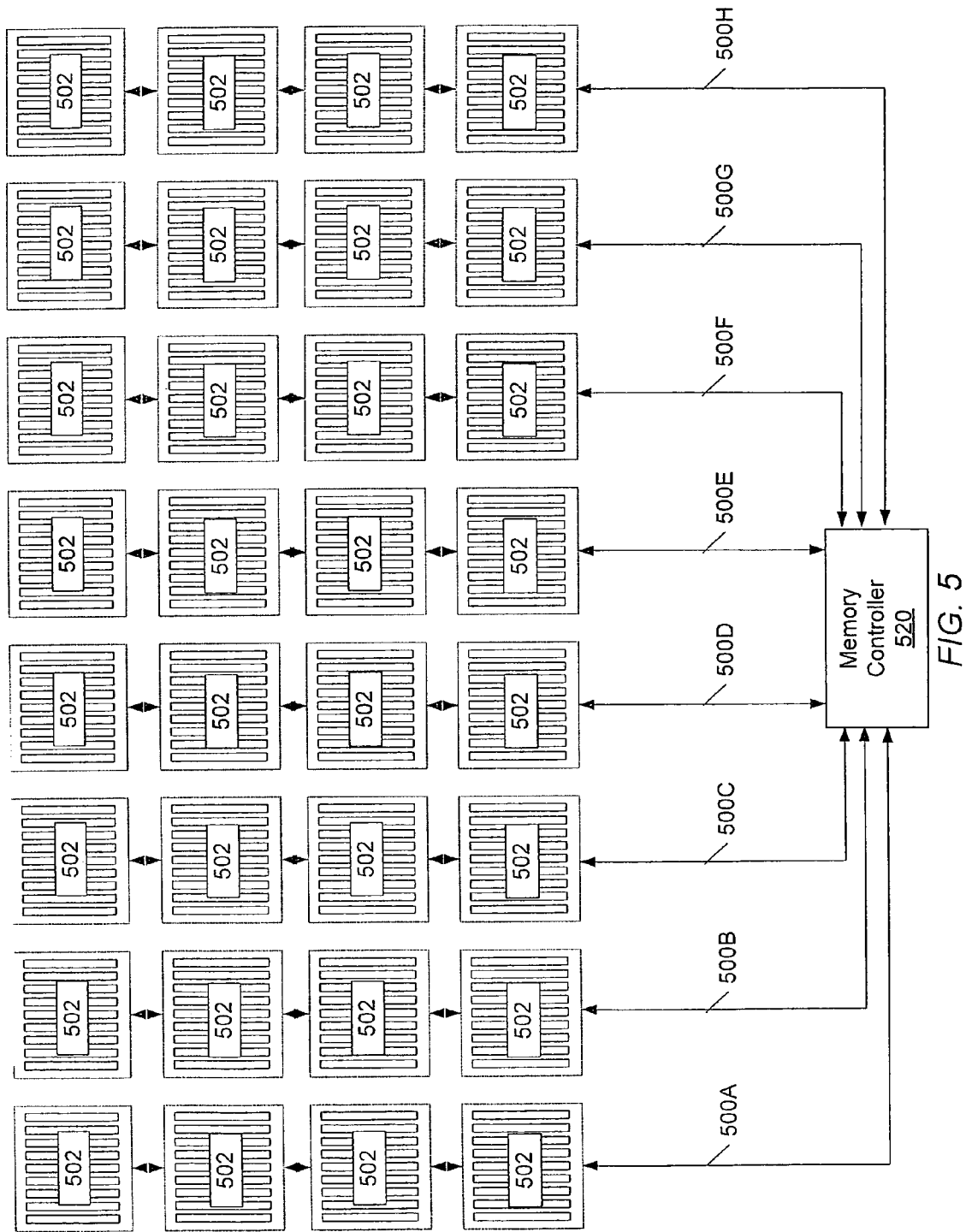
FIG. 5 is a block diagram of one embodiment of a portion of a memory subsystem with switching circuits.
Figure 6:
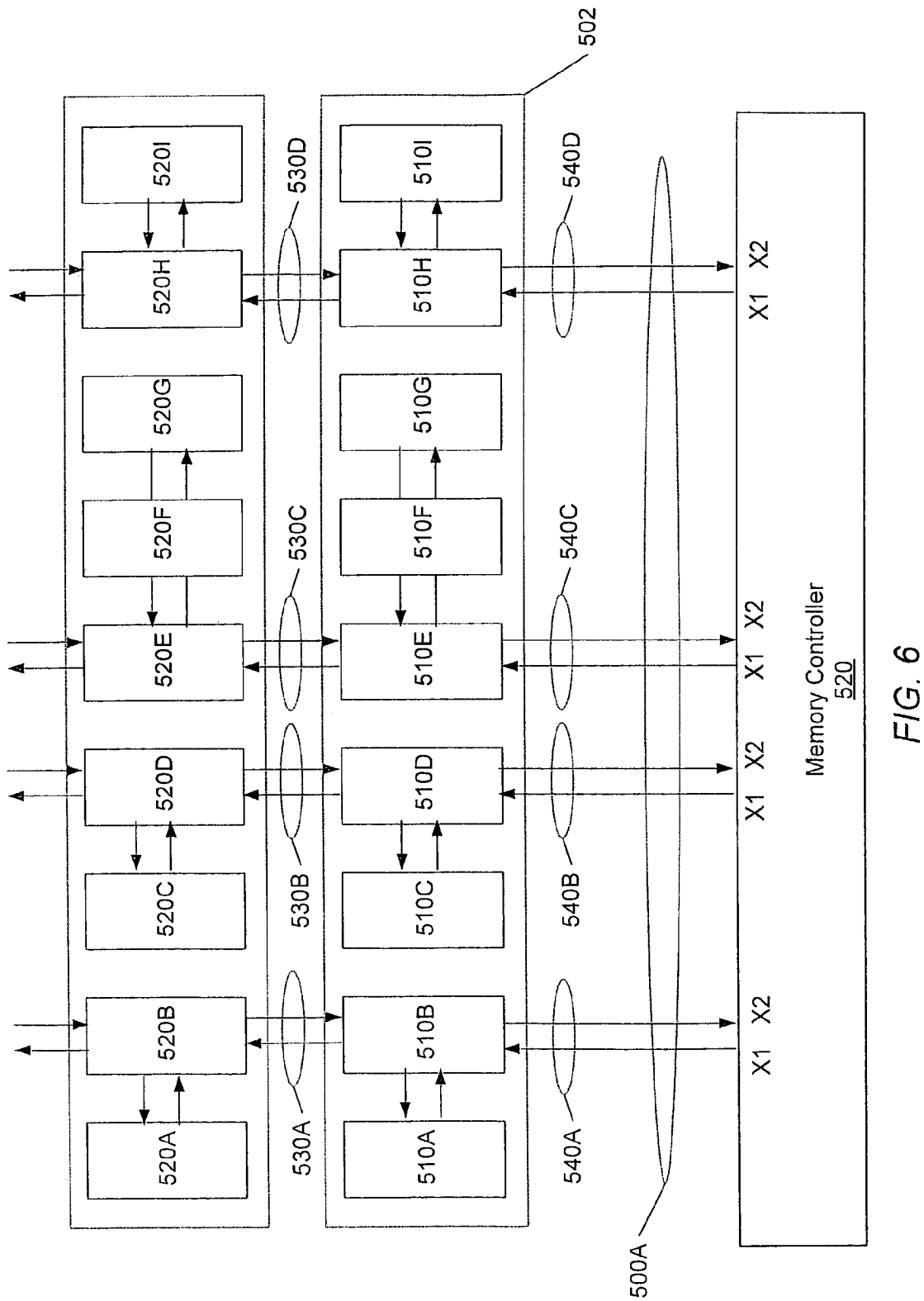
FIG. 6 is a block diagram of one embodiment of a portion of a memory subsystem with switching circuits.

FIG. 5 depicts an embodiment in which a memory controller 520 is coupled via eight different bi-directional links 500A-500H to eight memory modules 502. Each of those eight memory modules is in turn coupled to three more memory modules 502. Accordingly, 32 memory modules are coupled in the memory subsystem shown. As in the above described embodiments, each of the memory modules 502 may include switching circuitry to support routing of data between the memory modules and memory controller 520. In one embodiment, each of the bi-directional links 500A-500H comprise multiple bi-directional links. For example, FIG. 6 depicts a portion of the subsystem of FIG. 5. FIG. 6 depicts memory controller 520 coupled via link 500A to a memory module 502 and illustrates that a given memory module may be configured with more than a single switching circuit as desired. As seen in the example, link 500A comprises four links 540A-540D. Memory module 502 in FIG. 6 then includes four switching circuits 510B, 510D, 510E, and 510H which are coupled to the memory controller 520 via links 540. Each of switching circuits 510 is further coupled to one or more DRAM chips on the memory module and another switching circuit (520B, 520, D, 520E, and 520H) on an adjacent memory module.

As in the previous examples, each switch in a given memory module may be configured to access fewer than all of the DRAM chips on the module. For example, switch 510B (which itself may comprise a DRAM chip) is coupled to chip 510A, switch 510D is coupled to chip 510C, switch 510E is coupled to chips 510F and 510G, and switch 510H is coupled to chip 510I. Accordingly, multiple accesses to DRAM chips on a given memory module may be performed in parallel via links 540A-540D. Further, as previously described, each chip may route read data directly back toward the memory controller 520 via a shortest path. Accordingly, the bandwidth between the memory controller and memory modules may be increased over prior art systems. In addition, links between DRAM chips and/or other components on a memory module, and as used herein generally the term "links", may comprise unidirectional, bidirectional, or point to multi-point links. Further, while the discussion distinguishes between switches and DRAM chips on a memory module (e.g., 510A and 510B), all such components may in fact be identical. In such an embodiment, all such components may have switching capability, though such capability may only be enabled in some. Alternatively, those components with switching capability could be different from components without switching capability.

In addition to the above, it is noted that as depicted in FIG. 6 switching functions may be distributed throughout any given memory module. In this manner, thermal cooling challenge that may be presented by a single switching circuit may be mitigated.

Figure 7:
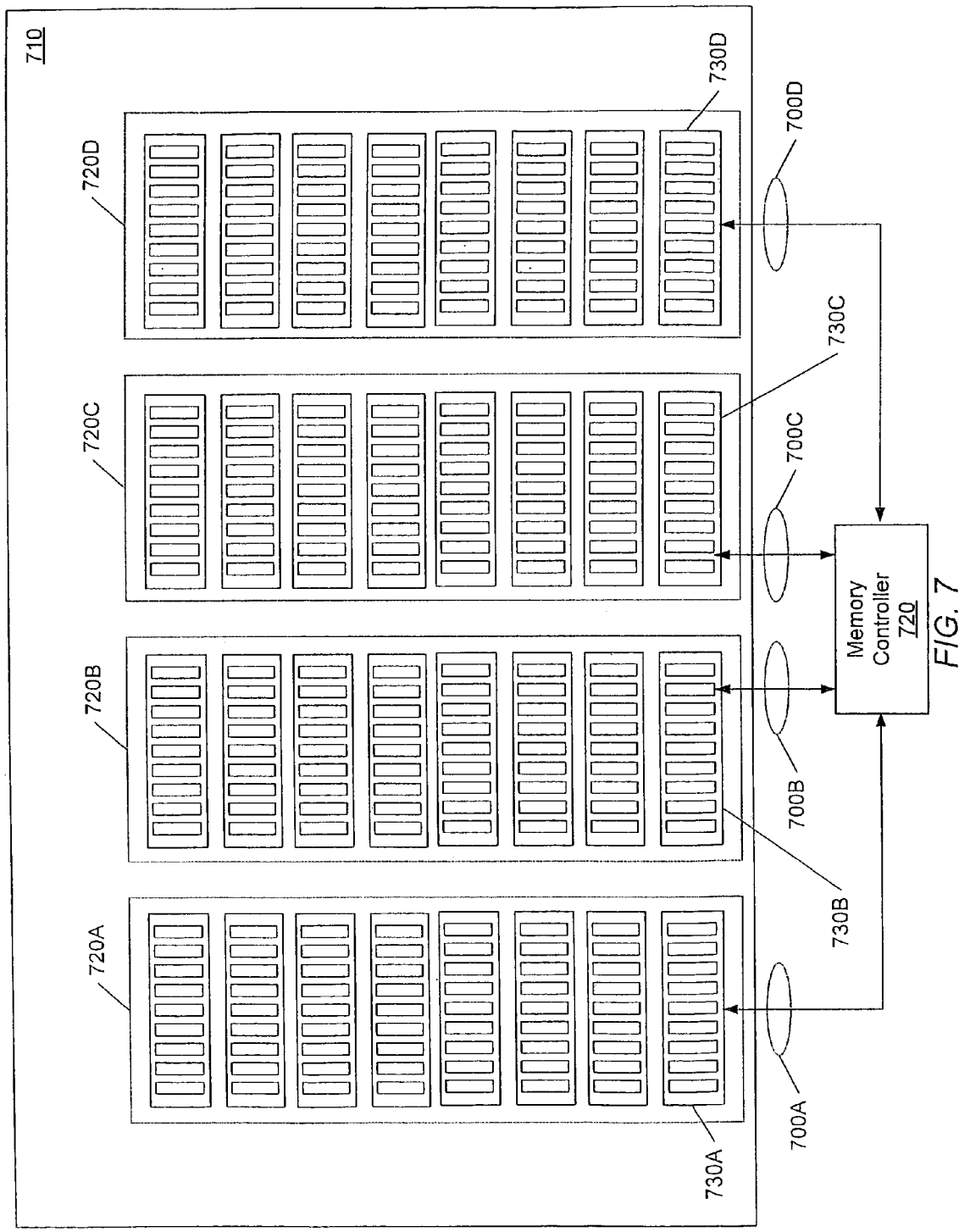
FIG. 7 is a block diagram of one embodiment of a portion of a memory subsystem with switching circuits.

FIG. 7 depicts yet another embodiment of memory subsystem utilizing memory modules which include switching circuitry. FIG. 7 shows a portion of a memory subsystem including a memory controller 720 and multiple memory modules 710. In the example shown, memory controller 720 is coupled to a first memory module 730A via a first link 700A, a second module 730B via a second link 700B, a third module 730C via a third link 700C, and a fourth module 730D via a fourth link 700D. In the example shown, memory modules 710 are generally formed as strings of modules. For example, module 730A is part of a string of modules 720A, module 730B is part of a string of modules 720B, module 730C is part of a string of modules 720C, and module 730D is part of a string of modules 720D. Therefore, data communication between memory controller 720 and any module in string 720A occurs via link 700A, data communication between memory controller 720 and any module in string 720B occurs via link 700B, and so on. In one embodiment, each memory module 710 depicted in FIG. 7 comprises multiple switching circuits.

Figure 8:
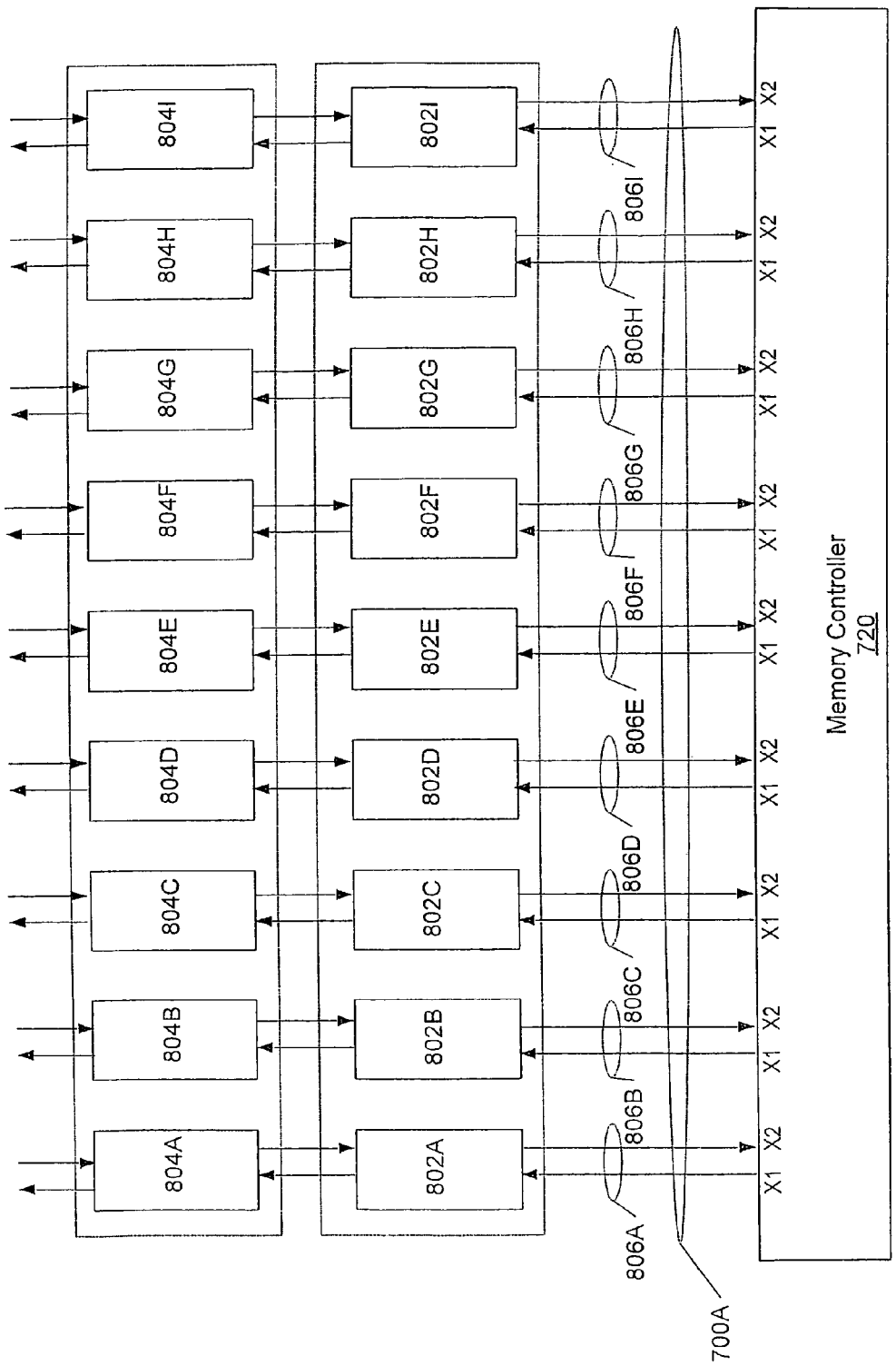
FIG. 8 is a block diagram of one embodiment of a portion of a memory subsystem with switching circuits.

FIG. 8 depicts a portion of the subsystem shown in FIG. 7. In particular, FIG. 8 shows memory controller 720, link 700, memory module 730A which is part of the string of memory modules 720A. As can be seen in FIG. 8, link 700A actually comprises nine separate bidirectional links 806A-806I. Further, memory module 730A comprises nine switching circuits 802A-802I (each of which may comprise one or more DRAM chips) coupled to each of links 806A-806I. As can be seen in the example, each of circuits 802 is not coupled to another switching circuit within the same memory module 730A. Rather, each circuit 802 is either coupled to a switch in another memory module, or is coupled directly to the memory controller 720. For example, circuit 802A is coupled to circuit 804A, circuit 802B is coupled to circuit 804B, and so on.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A memory subsystem comprising:
   a host configured to initiate memory accesses, said host being coupled to a first memory module of a plurality of memory modules by one or more links, each of said memory modules including one or more memory chips; and
   a switching circuit configured to convey data, the switching circuit being manufactured in a stacked formation with at least one of the memory chips, wherein the switching circuit is configured to:
      detect a memory access initiated by the host;
      route the detected access to another memory module of said memory modules, in response to determining the access is not directed to a memory chip of the first memory module; and
      process the detected access within the first memory module, in response to determining the access is directed to a memory chip of the first memory module;
   wherein when a switching circuit in a particular memory chip retrieves data from a memory chip, the switching circuit conveys the retrieved data either (i) directly to the host, or (ii) to a switching circuit in a memory chip which is closer to the host than the particular memory module.

2. The memory subsystem as recited in claim 1, wherein the first memory module is coupled to one or more of the other plurality of memory modules via serial links, and wherein the switching circuit comprises circuitry configured to de-serialize data and serialize data.

3. The memory subsystem as recited in claim 1, wherein the stacked formation comprises a stacked die formation.

4. The memory subsystem as recited in claim 3, wherein each switching circuit is configured to de-serialize data prior to conveyance to a memory chip, and wherein each switching circuit is configured to serialize data received from a memory chip prior to transmitting the received data.

5. The memory subsystem as recited in claim 1, wherein each switching circuit further comprises multiplexing circuitry configured to select for conveyance toward the host either (i) data received from another switching circuit, or (ii) data received from a memory chip on the same memory module as a switching circuit performing the multiplexing.

6. The memory subsystem as recited in claim 1, wherein the stacked switching circuit and memory chip are coupled via a flexible interconnect.

7. A memory module for use in a memory subsystem, the module comprising:
 a plurality of memory chips;
 wherein at least one of the memory chips is manufactured in a stacked formation with a switching circuit configured to:
  detect a memory access initiated by the host;
  route the detected access to another switching circuit in a different memory module, in response to determining the access is not directed to a memory chip of the first memory module; and
  process the detected access, in response to determining the access is directed to a memory chip on the memory module;
 wherein when the switching circuit retrieves data from a memory chip of the memory module, the switching circuit conveys the retrieved data either (i) directly to the host, or (ii) to a switching circuit in a second memory module which is closer to the host than said memory chip which includes the switching circuit.

8. The memory module as recited in claim 7, wherein the switching circuit is configured to be coupled to either (i) a switching circuit of another memory module, or (ii) the host.

9. The memory module as recited in claim 8, further comprising circuitry configured to de-serialize data and serialize data.

10. The memory module as recited in claim 9, wherein the stacked formation comprises a stacked die formation.

11. The memory module as recited in claim 9, wherein the memory module includes a plurality of dynamic random access memory (DRAM) chips, and wherein the switching circuit is configured to de-serialize data prior to conveyance to a DRAM chip, and wherein the switching circuit is configured to serialize data received from a DRAM chip prior to transmitting the received data.

12. The memory module as recited in claim 11, wherein the switching circuit further comprises multiplexing circuitry configured to select for conveyance either (i) data received from another switching circuit, or (ii) data received from one of the DRAM chips.

13. The memory module as recited in claim 7, wherein the stacked switching circuit and memory chip are coupled via a flexible interconnect.

14. A method in a memory subsystem, the method comprising:
 a host initiating a memory access;
 a first memory module detecting the memory access;
 a switching circuit manufactured in a stacked formation with a memory chip of the first memory module:
  routing the detected access to a second memory module of a plurality of memory modules, in response to determining the access is not directed to a memory chip of the first memory module;
  processing the detected access within the first memory module, in response to determining the access is directed to a memory chip of the first memory module;
  retrieving data from a memory chip of the first memory module; and
  conveying the retrieved data either (i) directly to the host, or (ii) to a switching circuit in a memory module which is closer to the host than the first memory module.

15. The method as recited in claim 14, wherein the first memory module is coupled to one or more of the other plurality of memory modules via links, and wherein the switching circuit comprises circuitry configured to de-serialize data and serialize data.

16. The method as recited in claim 14, wherein the stacked formation comprises a stacked die formation, and wherein the switching circuit and memory chip are coupled via a flexible interconnect.

17. The method as recited in claim 16, further comprising each additional switching circuit de-serializing data prior to conveyance to a memory chip, and each switching circuit serializing data received from a memory chip prior to transmitting the received data.

* * * * *